(12) United States Patent
Tanaka

(10) Patent No.: US 9,153,636 B2
(45) Date of Patent: Oct. 6, 2015

(54) DISPLAY DEVICE AND METHOD FOR MANUFACTURING THE SAME

(71) Applicant: JOLED INC., Tokyo (JP)

(72) Inventor: Yuji Tanaka, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/536,084

(22) Filed: Nov. 7, 2014

(65) Prior Publication Data
US 2015/0137098 A1 May 21, 2015

(30) Foreign Application Priority Data

Nov. 20, 2013 (JP) .................. 2013-239657

(51) Int. Cl.
*H01L 27/32* (2006.01)
*H01L 51/52* (2006.01)
*H01L 51/56* (2006.01)

(52) U.S. Cl.
CPC ........ *H01L 27/3276* (2013.01); *H01L 27/3253* (2013.01); *H01L 51/5246* (2013.01); *H01L 51/56* (2013.01); *H01L 2227/323* (2013.01); *H01L 2251/5338* (2013.01)

(58) Field of Classification Search
CPC ............ H01L 27/3276; H01L 27/3253; H01L 51/5246; H01L 51/56; H01L 2227/323; H01L 2251/338

USPC ...... 313/148–145, 346 R; 123/32, 42, 169 R, 123/169 EL
See application file for complete search history.

(56) References Cited

U.S. PATENT DOCUMENTS

2003/0174275 A1  9/2003  Asano et al.
2008/0212000 A1  9/2008  French et al.

FOREIGN PATENT DOCUMENTS

| JP | 9-127536 | 5/1997 |
| JP | 2010-048887 | 3/2010 |
| JP | 4870156 | 2/2012 |
| WO | 02/084739 | 10/2002 |

*Primary Examiner* — Tracie Y Green
(74) *Attorney, Agent, or Firm* — Greenblum & Bernstein, P.L.C.

(57) ABSTRACT

A display device according to the present disclosure includes: a first substrate including a front surface and a rear surface, the front surface defining thereon a first region, a second region, and a third region, the rear surface defining thereon a fourth region, a fifth region, and a sixth region respectively opposing the first region, the second region and the third region; a display element provided on the first region; a wire provided on the second region and electrically connected to the display element; a driving element provided above the third region; and a second substrate provided to be in contact with the fourth region, the fifth region, and the six region, and being composed of a material with higher rigidity than the first substrate, a portion thereof in contact with the sixth region having a smaller thickness than a portion thereof in contact with the fourth region.

21 Claims, 13 Drawing Sheets

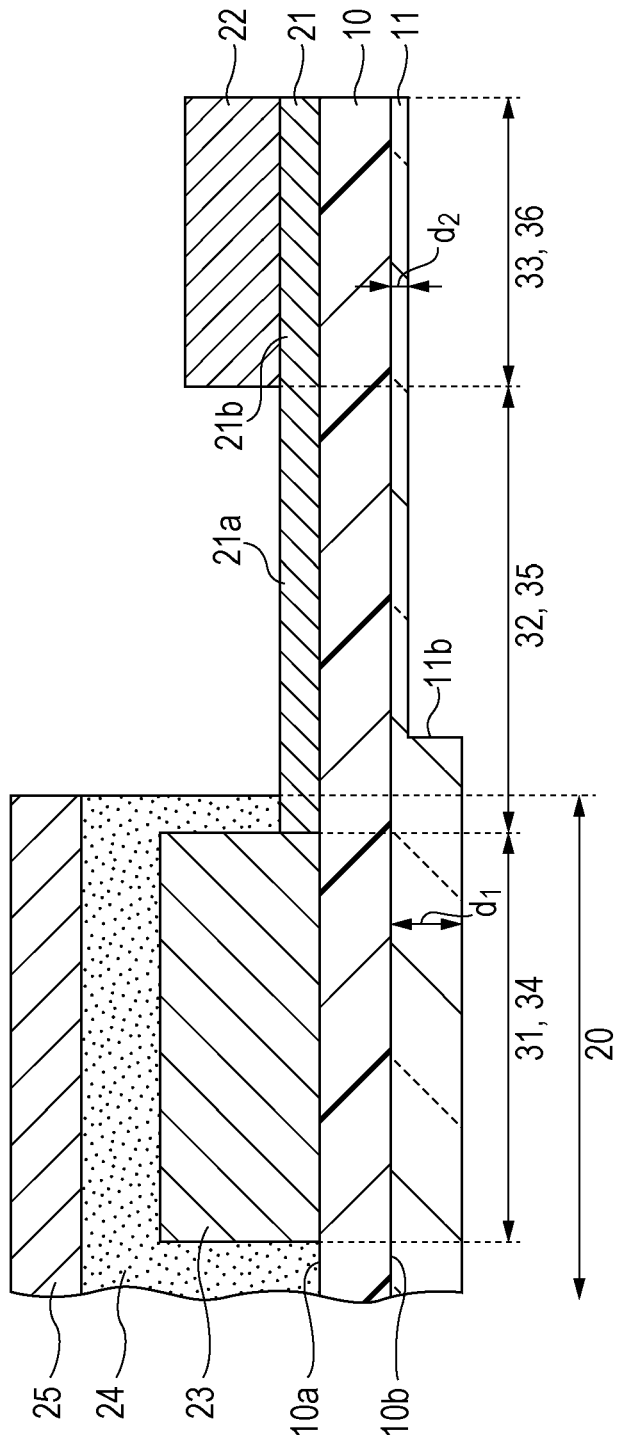

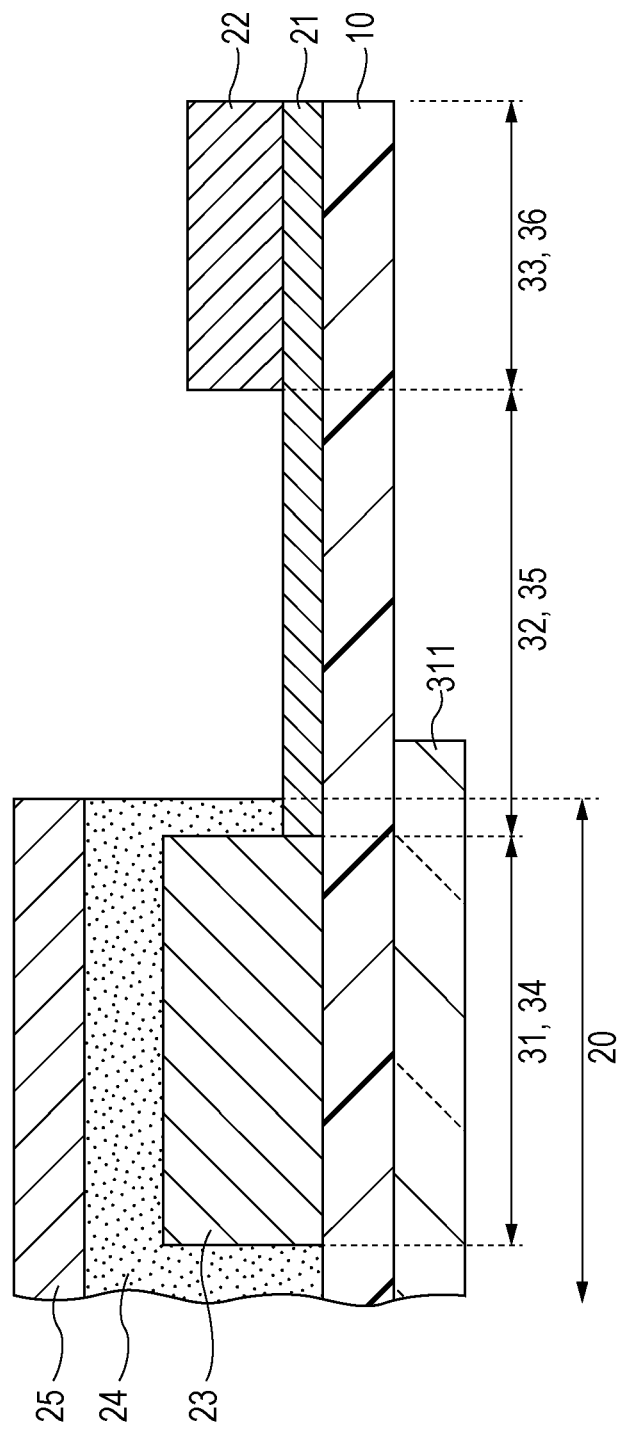

DISPLAY DEVICE AND METHOD FOR MANUFACTURING THE SAME

CROSS REFERENCES TO RELATED APPLICATIONS

This application claims priority to Japanese Patent Application No. 2013-239657, filed on Nov. 20, 2013, the contents of which are hereby incorporated by reference.

BACKGROUND

1. Technical Field

The present disclosure relates to display devices. In particular, the present disclosure relates to a display device provided with a displaying unit at a front surface of a flexible substrate having a rigid substrate at a rear surface thereof, and to a method for manufacturing the display device.

2. Description of the Related Art

As portable information terminals and the like are becoming more and more popular in recent years, there are strong demands for thickness reduction, weight reduction, and improved durability in display devices equipped in these terminals. In addition to these demands, there is recently also an increasing demand for display devices with high flexibility. In order to meet such demands, manufacturing methods for display devices have been studied.

For example, in order to achieve thickness reduction, weight reduction, and flexibility of a display device, there has been studied a display-device manufacturing method that involves forming, for example, a display element unit on a glass substrate and subsequently reducing the thickness of the entire glass substrate by grinding the glass substrate. On the other hand, in order to achieve durability and flexibility of a display device, there have been studied a configuration that uses a resin substrate and a thin glass substrate and a configuration that uses a resin substrate alone. PCT International Publication No. 2002/084739 discloses a display-device manufacturing method that involves forming a thin-film transistor on a glass substrate, removing the entire glass substrate, and then transferring the thin-film transistor onto a resin substrate. Japanese Patent No. 4870156 discloses a display-device manufacturing method that involves forming a resin substrate on a glass substrate, forming, for example, a display element unit on the resin substrate, and then separating the resin substrate from the glass substrate.

In general, a display device includes a substrate, a display element unit provided on the substrate, and a driving integrated circuit (IC) electrically connected to the display element unit. The display element unit is provided with, for example, a thin-film transistor therein. With this configuration, when a video signal from an external device is input to the display element unit via the driving IC, the thin-film transistor is driven in correspondence with the video signal, so that the display device displays a video picture.

In order to electrically connect the display element unit and the driving IC to each other, there is a method of directly connecting the driving IC to the wire electrically connected to the display element unit and a method of connecting via a flexible printed circuit (referred to as "FPC" hereinafter). When using the direct connection method, the driving IC is electrically connected to the wire, which extends from the display element unit. When using the via-FPC connection method, an output terminal of the driving IC is mounted in the FPC such that the output terminal of the driving IC is disposed on the FPC and is electrically connected to the wire provided in the FPC. Then, an output terminal of the FPC is electrically connected to the wire, which extends from the display element unit, on the substrate. Either of the two connection methods uses an anisotropic conductive film (referred to as "ACF" hereinafter). By thermo-compression-bonding the two terminals connected to each other via the ACF, the two terminals can be electrically connected to each other.

SUMMARY

The present disclosure suppresses damage to the rigid substrate during compression-bonding of the connection area between the wire and the driving element unit while achieving both flexibility of the display device and sealing properties in the display element unit.

A display device according to an aspect of the present disclosure includes a first substrate including a front surface and a rear surface, the front surface at least defining thereon a first region, a second region, and a third region in this order, the rear surface at least defining thereon a fourth region, a fifth region, and a sixth region respectively opposing the first region, the second region and the third region; a display element provided on the first region; a wire provided on the second region and electrically connected to the display element; a driving element provided via the wire above the third region and electrically connected to the wire; and a second substrate provided to be in contact with the fourth region, the fifth region, and the six region, and being composed of a material with higher rigidity than the first substrate, a portion thereof in contact with the sixth region having a smaller thickness than a portion thereof in contact with the fourth region.

Additional benefits and advantages of the disclosed embodiments will be apparent from the specification and figures. The benefits and/or advantages may be individually provided by the various embodiments and features of the specification and figures, and need not all be provided in order to obtain one or more of the same.

BRIEF DESCRIPTION OF THE DRAWINGS

FIG. 2 is a schematic cross-sectional view of the display device shown in FIG. 1;

FIG. 9 is a schematic cross-sectional view of a display device according to a third embodiment;

DETAILED DESCRIPTION

Figure 1:
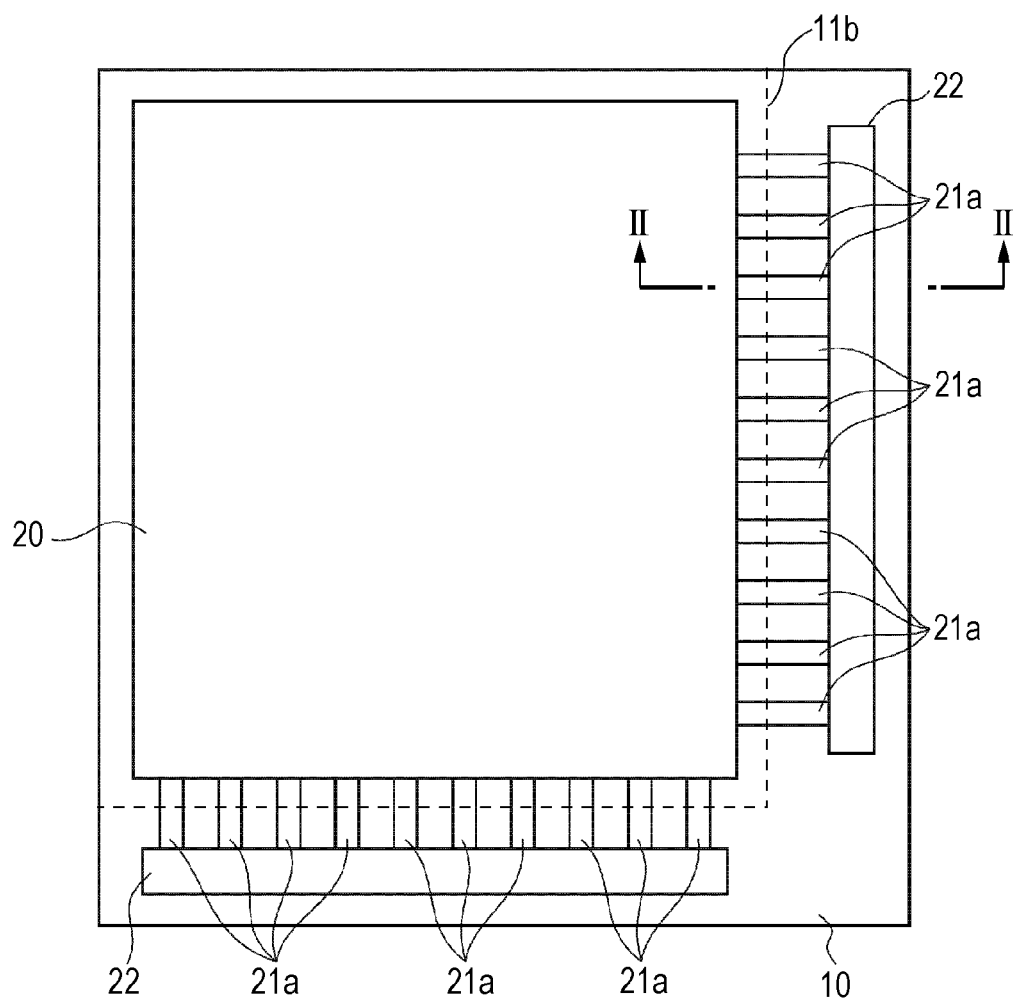
FIG. 1 is a schematic plan view illustrating a display device according to a first embodiment.

Reasons for which Aspects of Present Invention are Reached

As described above, in order to electrically connect a display element unit and a driving element unit to each other, the driving element unit and a wire electrically connected to the display element unit need to be connected to each other. In detail, normally, a connecting unit extending from the wire and one of an output terminal of the driving element unit and an output terminal of an FPC are connected to each other on a substrate, and the connection area is compression-bonded. When a flexible substrate such as a resin substrate and a rigid substrate such as a thick glass substrate are used, pressure is sometimes applied to the rigid substrate during compression-bonding of the connection area. As a result, the rigid substrate may possibly break or crack. In other words, when the rigid substrate is damaged, the yield of the display device may possibly decrease.

On the other hand, in a display device having a flexible substrate alone, moisture in the air existing outside the display element unit may penetrate through the flexible substrate, possibly deteriorating the display element unit due to the moisture. In other words, since sealing properties are insufficient in the display device having the flexible substrate alone, the display element unit may possibly deteriorate. Based on the reasons described above, the present inventor has reached aspects of the present disclosure to be described below.

General Outline of Aspects of Present Disclosure

A display device according to a first aspect of the present disclosure includes a first substrate including a front surface and a rear surface, the front surface at least defining thereon a first region, a second region, and a third region in this order, the rear surface at least defining thereon a fourth region, a fifth region, and a sixth region respectively opposing the first region, the second region and the third region; a display element provided on the first region; a wire provided on the second region and electrically connected to the display element; a driving element provided via the wire above the third region and electrically connected to the wire; and a second substrate provided to be in contact with the fourth region, the fifth region, and the six region, and being composed of a material with higher rigidity than the first substrate, a portion thereof in contact with the sixth region having a smaller thickness than a portion thereof in contact with the fourth region.

In the display device according to the first aspect of the present disclosure, damage to the second substrate can be suppressed during compression-bonding of the connection area between the wire and the driving element unit, while both flexibility of the display device and sealing properties in the display element unit can be achieved.

In the display device according to the first aspect, the first substrate may comprise a resin substrate, and the second substrate may comprise a glass substrate. Furthermore, the thickness of the glass substrate on the fourth region may be larger than 1 μm and smaller than or equal to 200 μm.

According to the first aspect of the present disclosure, by making the thickness of the glass substrate larger than 1 μm, the glass substrate on the fourth region may suppress entry of moisture into the display element unit from the outside. Therefore, sealing properties in the display element unit can be ensured. Moreover, by making the thickness of the glass substrate smaller than or equal to 200 μm, the glass substrate is less likely to break or crack even when the display device is bent.

Furthermore, in the display device according to the first aspect, the thickness of the glass substrate on the sixth region may be larger than 0 μm and smaller than or equal to 1 μm.

According to the first aspect of the present disclosure, the occurrence of breakage or cracking of the glass substrate can be suppressed during compression-bonding of the driving element unit.

Furthermore, in the display device according to the first aspect, the thickness of the second substrate on the fourth region may be larger than the thickness of the second substrate on the sixth region, with respect to an entire region of the forth region.

According to the first aspect of the present disclosure, sealing properties in the display element unit can be maintained at a satisfactory level, as compared with a display device in which a second substrate with a thickness smaller than or equal to a thickness of the second substrate on the sixth region is disposed on a part of the fourth region.

Furthermore, in the display device according to the first aspect, the second substrate may have a tapered section on the fifth region, thickness of the tapered section decreasing in a direction from the second substrate on the fourth region toward the second substrate on the sixth region. Moreover, an end of the tapered section closer to the second substrate on the fourth region, may be located closer toward an inner peripheral edge of the driving element than an outer peripheral edge of the display element. The inner peripheral edge of the driving element is opposed to the outer peripheral edge of the display element.

According to the first aspect of the present disclosure, sealing properties in the display element unit can be further improved.

Furthermore, the display element may include an emitting layer composed of an organic material and includes an element sealing layer that surrounds the emitting layer. A tapered section may be provided on the fifth region, thickness of the tapered section decreases in a direction toward the second substrate on the sixth region. An end of the tapered section farther from the second substrate on the sixth region, may be located within the second substrate on the fourth region and outside an outer peripheral edge of the emitting layer.

According to the first aspect of the present disclosure, an area of the tapered section where the thickness decreases is disposed outside the emitting layer that is susceptible to, for example, moisture, whereby deterioration in sealing properties of the display device can be suppressed.

Furthermore, in the display device according to the first aspect, the driving element may include a driving integrated circuit that supplies electric power to the display element. The wire may be connected to the driving integrated circuit. Moreover, the first substrate may be folded to oppose the fifth region to the sixth region.

According to the first aspect of the present disclosure, since the driving element unit may be constituted of a circuit substrate and a driving IC, the range of selectivity in terms of design for the position of the driving IC is expanded. For example, when the driving IC is provided outside the circuit substrate (i.e., outside the display device), the circuit substrate can be folded so that the display device can be made narrower.

Furthermore, in the display device according to the first aspect, the thickness of the second substrate on the fourth region may be larger than a length extending between a first interface and a second interface when the first substrate is folded to face the fifth region to the sixth region. The first interface is placed between the first substrate and the second substrate on the fifth region. The second interface is placed between the first substrate and the second substrate on the sixth region. The length extending between the first interface and the second interface is larger than a sum of a thickness of the second substrate on the fifth region and the thickness of the second substrate on the sixth region.

According to the first aspect of the present disclosure, the display device can be reduced in size and can also be reduced in thickness.

Furthermore, in the display device according to the first aspect, a sum of the thickness of the second substrate on the fourth region and the thickness of the second substrate on the sixth region is larger than a length extending between a first interface and a second interface when the first substrate is folded to face the fifth region to the sixth region. The first interface is placed between the first substrate and the second substrate on the fifth region. The second interface is placed between the first substrate and the second substrate on the sixth region. Moreover, in the display device according to the first aspect, the first substrate may comprise a flexible substrate, and the second substrate may comprise a rigid substrate.

According to the first aspect of the present disclosure, when the display device is bent, the length extending between the first interface and the second interface can be reduced. Therefore, stress applied to the folding section of between the first interface and the second interface, where the stress is at maximum in the second substrate can be reduced. As a result, sealing properties in the display element unit can be further improved.

A method for manufacturing a display device according to a second aspect of the present disclosure includes (a) forming a first substrate on a front surface of a second substrate; (b) forming a display element on a first region of a front surface of the first substrate; (c) forming a wire, on a second region of the front surface of the first substrate, the wire being electrically connected to the display element, the second region being different from the first region; (d) forming a driving element on a third region of the front surface of the first substrate the third region being different from the first region and the second region; (e) pressing the driving element towards the wire to electrically connect a driving element and the wire to each other on the third region; and (f) etching at least a portion of the second substrate. The etching (f) comprises performing etching a portion of the second substrate that is in contact with at least a part of a fifth region and a sixth region of the rear surface of the first substrate, the fifth region and the sixth region being respectively opposed to the second region and the third region of the first substrate, a thickness of the second substrate on the sixth region being smaller than a thickness of the second substrate on the fourth region.

In the method for manufacturing a display device according to the second aspect of the present disclosure, damage to the second substrate can be suppressed during compression-bonding of a connection area between the wire and the driving element unit, while both flexibility of the display device and sealing properties in the display element unit can be achieved.

In the method for manufacturing a display device according to the second aspect, in the etching (f), a recessed end of the second substrate that is formed by the etching (f) is located within an area corresponding to a fifth region of the rear surface of the first substrate. The fifth region is opposed to the second region of the front surface of the first substrate.

Moreover, in the etching (f), at least a part of the second substrate that is in contact with the fifth region of the rear surface of the first substrate has a tapered shape. The fifth region is opposed to the second region of the front surface of the first substrate. Thickness of the tapered shape decreases in a direction from the second substrate on the fourth region toward the second substrate on the sixth region.

Moreover, in the etching (f), a first point of the tapered shape is located closer toward an inner peripheral edge of the driving element than an outer peripheral edge of the display element, the inner peripheral edge facing to the outer peripheral edge, and a second point of the tapered shape is located closer toward the inner peripheral edge of the driving element than the start point.

Accordingly, the thickness of the second substrate on the sixth region becomes smaller than the thickness of the second substrate on the fourth region. As a result, damaging or cracking of the second substrate on the sixth region can be suppressed.

A display device according to a third aspect of the present disclosure includes: a first substrate including a front surface and a rear surface, the front surface at least defining thereon a first region, a second region, and a third region, the rear surface at least defining thereon a fourth region, a fifth region, and a sixth region respectively opposing the first region, the second region and the third region; a display element provided on the first region; a wire provided on the second region and electrically connected to the display element; a driving element provided via the wire above the third region and electrically connected to the wire; and a second substrate provided to be in contact with the fourth region and at least a part of the fifth region.

Furthermore, in the display device according to the third aspect, the second substrate is not provided on a remaining part of the fifth region and a sixth region of the rear surface of the first substrate, the sixth region being opposed to the third region of the first substrate.

A method for manufacturing a display device according to a fourth aspect of the present disclosure includes (a) forming a first substrate on a front surface of a second substrate; (b) forming a display element on a first region of a front surface of the first substrate; (c) forming a wire, on a second region of the front surface of the first substrate, the wire being electrically connected to the display element, the second region being different from the first region; (d) forming a driving element on a third region of the front surface of the first substrate the third region being different from the first region and the second region; (e) pressing the driving element towards the wire to electrically connect a driving element and the wire to each other on the third region; and (f) etching at least a portion of the second substrate. The etching (f) comprises performing etching a portion of the second substrate that is in contact with at least a part of a fifth region and a sixth region of a rear surface of the first substrate, the fifth region being opposed to the second region of the first substrate, the sixth region being opposed to the third region of the first substrate.

Furthermore, in the method for manufacturing a display device according to the second aspect, the second substrate is in contact with the fourth region and at least the part of the fifth region of the rear surface of the first substrate. The second substrate is not provided on a remaining part of the fifth region and the sixth region of the rear surface of the first substrate.

First Embodiment

A display device according to a first embodiment of the present disclosure will be described in detail below with reference to FIGS. 1 and 2.

1. Overall Configuration

FIG. 1 is a schematic plan view illustrating a display device 1 according to the first embodiment. As shown in FIG. 1, the display device 1 includes a flexible substrate 10, a displaying unit 20, wires 21a, and a driving element unit 22. FIG. 2 is a schematic cross-sectional view of the display device 1 shown in FIG. 1, taken along a line II-II. As shown in FIG. 2, in addition to the components shown in FIG. 1, the display device 1 includes a rigid substrate 11, a connecting unit 21b, an adhesive layer 24, and a sealing layer 25. The flexible substrate 10 may be a substrate having flexibility, such as a resin substrate. The rigid substrate 11 may be a substrate with high rigidity, such as a glass substrate. In the first embodiment, a resin substrate is used as the flexible substrate 10, and a glass substrate is used as the rigid substrate 11.

The display device 1 is an organic electro-luminescence (EL) display panel having flexibility and is of a top emission type that extracts light from a display element unit 23 from the opposite side of the resin substrate 10. The displaying unit 20 is provided with a plurality of organic EL elements. Each component of the display device 1 will be described in detail below.

2. Configuration of Each Component

Resin Substrate 10

The resin substrate 10 is a resin film composed of a flexible material. A front surface 10a of the resin substrate 10 has a first region 31, a second region 32, and a third region 33. A rear surface 10b of the resin substrate 10 has a fourth region 34 corresponding to the first region 31, a fifth region 35 corresponding to the second region 32, and a sixth region 36 corresponding to the third region 33. The displaying unit 20 is provided on the first region 31, the wires 21a are provided on the second region 32, and the driving element unit 22 is provided via the wires 21a above the third region 33.

The resin substrate 10 is composed of, for example, polyimide. Alternatively, the resin substrate 10 may be composed of, for example, polyester, polyphenylene sulfide, polyamide, polyamide-imide, polycarbonate, cyclic polyolefin, or acrylic resin.

Glass Substrate 11

The glass substrate 11 is in contact with the fourth region 34, the fifth region 35, and the six region 36 of the rear surface 10b of the resin substrate 10n. A dashed line shown in FIG. 1 denotes a boundary section (recessed end surface) 11b where the thickness of the glass substrate 11 changes. The thickness of the glass substrate 11 is reduced in an L-shaped region existing outside the dashed line (i.e., outer peripheral side of the display device 1). Referring back to FIG. 2, the boundary section 11b where the thickness of the glass substrate 11 changes has a stepped shape when the glass substrate 11 is viewed in cross section. A portion of the glass substrate 11 on the sixth region 36 has a thickness $d_2$ that is smaller than a thickness $d_1$ of a portion of the glass substrate 11 on the fourth region 34. On the entire fourth region 34 of the glass substrate 11, the thickness of the glass substrate 11 is equal to $d_1$, which is larger than the thickness $d_2$ of the portion of the glass substrate 11 on the sixth region 36. The thickness $d_1$ of the portion of the glass substrate 11 on the fourth region 34 does not necessarily have to be fixed and may be within a range larger than 1 μm and smaller than or equal to 200 μm. Likewise, the thickness $d_2$ of the portion of the glass substrate 11 on the sixth region 36 does not necessarily have to be fixed and may be within a range larger than 0 μm and smaller than or equal to 1 μm. In this case, the thicknesses $d_1$ and $d_2$ of the glass substrate 11 are an average thickness value of the portion of the glass substrate 11 on the fourth region 34 and an average thickness value of the portion of the glass substrate 11 on the sixth region 36, respectively. The thickness $d_1$ of the glass substrate 11 is, for example, larger than 1 μm and smaller than or equal to 200 μm. By making the thickness $d_1$ of the glass substrate 11 larger than 1 μm, the portion of the glass substrate 11 on the fourth region 34 can suppress entry of moisture into the display element unit 23 from the outside. Therefore, sealing properties in the display element unit 23 can be ensured. Furthermore, by making the thickness $d_1$ of the glass substrate 11 smaller than or equal to 200 μm, the glass substrate 11 is less likely to break or crack even when the display device 1 is bent. On the other hand, the thickness $d_2$ of the glass substrate 11 is larger than 0 μm and smaller than or equal to 1 μm. If the thickness $d_2$ of the glass substrate 11 is larger than 1 μm, the glass substrate 11 may possibly break or crack during compression-bonding of the driving element unit 22. This will be described later.

The glass substrate 11 is composed of a material with higher rigidity than the resin substrate 10 and may be, for example, non-alkali glass. Alternatively, the glass substrate 11 may be composed of, for example, soda glass, nonfluorescent glass, phosphate glass, borate glass, or quartz.

Displaying Unit

The display element unit 23 includes organic EL elements, a planarization layer, and a thin-film transistor (TFT) layer. The organic EL elements are disposed above the TFT layer via the planarization layer.

Each organic EL element includes an anode, an emitting layer composed of an organic material, a cathode, and an element sealing layer. A region where the emitting layer is disposed will be referred to as "emitting region" hereinafter. The emitting region is covered with the element sealing layer so that the anode, the emitting layer, and the cathode are prevented from deteriorating due to moisture entering from the outside. In other words, the emitting layer is surrounded by the element sealing layer. The element sealing layer is constituted of an inorganic sealing layer having an inorganic material as a main component and a resin sealing layer having a resin material as a main component. In the display element unit 23, the inorganic sealing layer is disposed above the emitting region, and the outer periphery of the inorganic sealing layer is further covered with the resin sealing layer. Although not shown, it is clear from FIG. 2 that an outer peripheral edge of an inorganic sealing layer constituting the sealing layer 25 is located in a region closer to the driving element unit 22 relative to the emitting region of the display element unit 23, and an outer peripheral edge of the resin sealing layer covering the outer periphery of the aforementioned inorganic sealing layer is located in a region even closer to the driving element unit 22 relative to the outer peripheral edge of the inorganic sealing layer. Furthermore, the boundary section 11b where the thickness of the glass substrate 11 changes is located in a region closer to the driving element unit 22 relative to the outer peripheral edge of the display element unit 23 and the outer peripheral edge of the sealing layer 25. In other words, the boundary section 11b where the thickness of the glass substrate 11 changes is located in a region closer to the driving element unit 22 relative to the emitting region of the organic EL element.

The TFT layer includes a thin-film transistor, an element such as a capacitor, and an insulating layer. The thin-film transistor has a function for driving the organic EL element. An electrode constituting the thin-film transistor is connected to wires, such as a selection line, a source line, and a signal line.

Wire Layer 21

A wire layer 21 is constituted of the wires 21a and the connecting unit 21b. The wires 21a are electrically connected to the organic EL elements within the display element unit 23. The wire layer 21 is composed of, for example, copper (Cu). Alternatively, the wire layer 21 may be composed of a conductive material such as metal.

Driving Element Unit 22

The driving element unit 22 is electrically connected to the wire layer 21 and supplies electric power to the display element unit 23. The driving element unit 22 is constituted of a driving integrated circuit (IC). The driving IC is directly connected to the connecting unit 21b via an anisotropic conductive film (ACF) (not shown). Thus, the wires 21a are connected to the driving IC. When driving the display device 1, a video signal input from an external video device is input from the driving IC to the display element unit 23 via the connecting unit 21b.

3. Method for Manufacturing Display Device 1

Next, a method for manufacturing the display device 1 will be described with reference to the drawings. FIGS. 3A to 3C, FIGS. 4A and 4B, and FIGS. 5A and 5B illustrate steps in the method for manufacturing the display device 1 shown in FIG. 1.

Figure 3A:
FIG. 3A schematically illustrates a method for manufacturing the display device shown in FIG. 1 and shows a step for preparing a resin substrate provided with a glass layer at a rear surface thereof.

First, as shown in FIG. 3A, a resin substrate 10 provided with a glass layer 11a at the rear surface thereof is prepared. Specifically, the resin substrate 10 composed of polyimide is formed on the glass layer 11a composed of non-alkali glass.

Figure 3B:
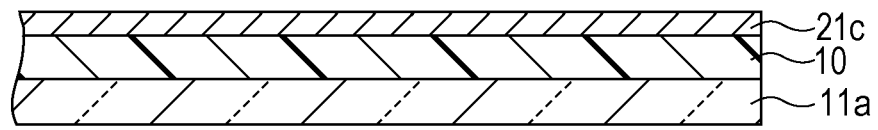
FIG. 3B schematically illustrates the method for manufacturing the display device shown in FIG. 1 and shows a step for forming a metallic wire layer.

Then, as shown in FIG. 3B, a wire-layer material 21c is laminated over the resin substrate 10. Specifically, the wire-layer material 21c is laminated by, for example, sputtering so that the thickness thereof becomes about several hundred nanometers.

Figure 3C:
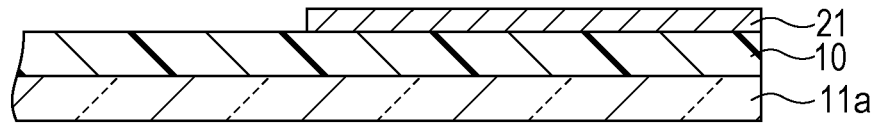
FIG. 3C schematically illustrates the method for manufacturing the display device shown in FIG. 1 and shows a step for forming a wire layer.

Subsequently, as shown in FIG. 3C, a wire layer 21 is formed on the resin substrate 10. Specifically, a resist is pattern-formed on the wire-layer material 21c by photolithography and is used as a mask for etching the wire-layer material 21c, whereby the wire layer 21 is formed.

Figure 4A:
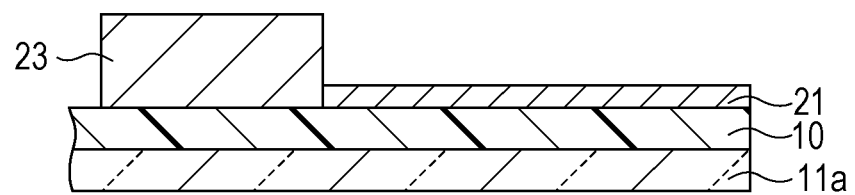
FIG. 4A schematically illustrates the method for manufacturing the display device shown in FIG. 1 and shows a step for forming a display element unit.

Next, as shown in FIG. 4A, a display element unit 23 is formed on the resin substrate 10. The display element unit 23 is connected to the wire layer 21. At the end of this process, a sealing layer is formed within the display element unit 23.

Figure 4B:
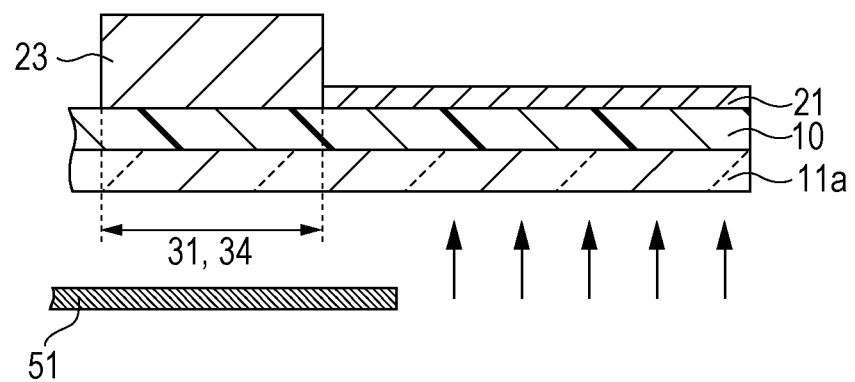
FIG. 4B schematically illustrates the method for manufacturing the display device shown in FIG. 1 and shows a step for etching the glass layer.

Then, as shown in FIG. 4B, a resist 51 formed by photolithography and covering a portion of the glass layer 11a that is in contact with a fourth region 34 of the rear surface of the resin substrate 10 is used as a mask for wet-etching the glass layer 11a.

Figure 5A:
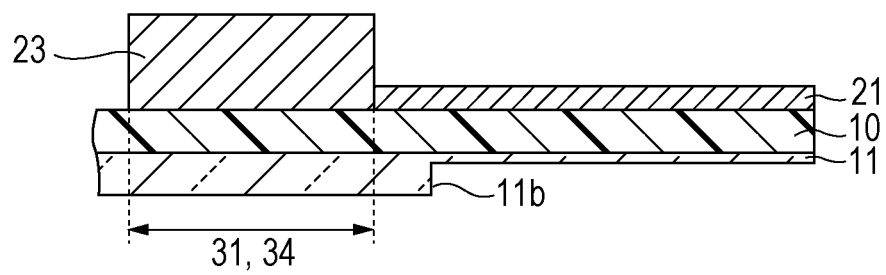
FIG. 5A schematically illustrates the method for manufacturing the display device shown in FIG. 1 and shows a step for forming a glass substrate on the rear surface.

As a result, as shown in FIG. 5A, a section where the resist 51 is not formed is etched, so that a glass substrate 11 with a reduced thickness in this section is formed. In this case, the etching is performed such that a recessed end surface 11b of the glass substrate 11 formed by etching is located within a portion of the glass substrate 11 that is in contact with a fifth region 35. This will be described later.

Figure 5B:
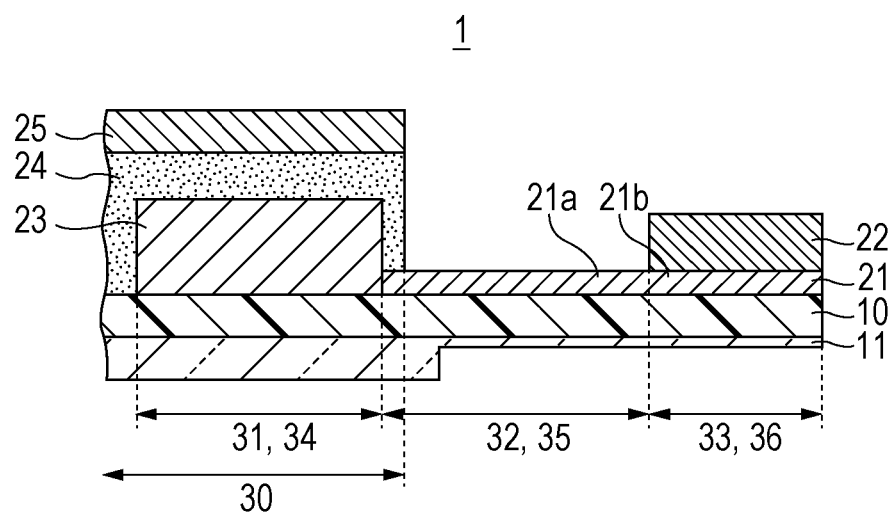
FIG. 5B schematically illustrates the method for manufacturing the display device shown in FIG. 1 and shows a step for forming a driving element unit, an adhesive layer, and a sealing layer.

Furthermore, as shown in FIG. 5B, a driving element unit 22 is compression-bonded to a connecting unit 21b, and a sealing layer 25 is bonded to the display element unit 23 via an adhesive layer 24, whereby the display device 1 is completed.

The step for compression-bonding the driving element unit 22 to the connecting unit 21b will be described in detail below.

Figure 6A:
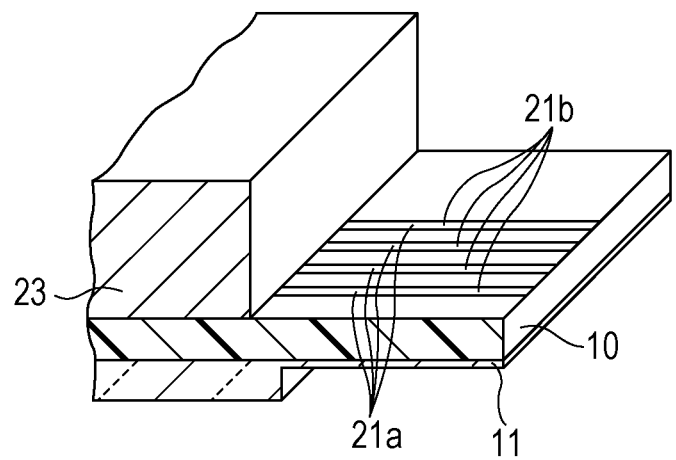
FIG. 6A schematically illustrates a step for forming the driving element unit in the method for manufacturing the display device shown in FIG. 1 and shows a state prior to formation of the driving element unit.
Figure 6B:
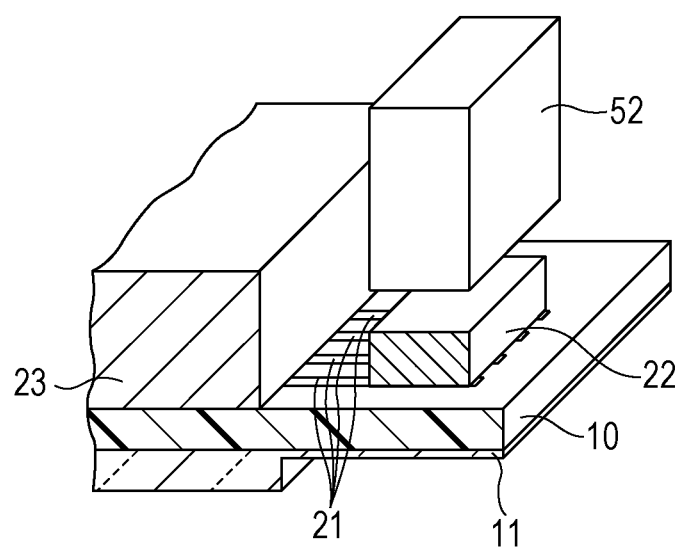
FIG. 6B schematically illustrates a step for forming the driving element unit in the method for manufacturing the display device shown in FIG. 1 and shows a compression-bonding step of the driving element unit.

FIG. 6A schematically illustrates a step for forming the driving element unit 22 in the display device 1 shown in FIG. 1 and shows a state prior to formation of the driving element unit 22. FIG. 6B illustrates a compression-bonding step of the driving element unit 22.

The driving element unit 22 and the connecting unit 21b are thermo-compression-bonded to each other via an anisotropic conductive film (ACF). FIG. 6A shows a state prior to thermo-compression-bonding. Specifically, the connecting unit 21b is first cleaned with, for example, acetone. Then, the ACF is bonded to the connecting unit 21b. As shown in FIG. 6B, after aligning a compression-bonding head 52 with the driving element unit 22, temporary compression-bonding is performed. Subsequently, the connecting unit 21b and the driving element unit 22 are permanently compression-bonded to each other via the ACF. Permanent compression-bonding is performed by pressing the driving element unit 22 and the connecting unit 21b provided with the ACF against each other while heating the driving element unit 22. As a result, the connecting unit 21b and the driving element unit 22 can achieve good adhesive properties and a good conductive state.

4. Effects

In the display device 1 according to the first embodiment, when performing compression-bonding of the driving element unit 22, a portion of the glass substrate 11 that is in contact with a sixth region 36 is less likely to break or crack. Furthermore, supposing that the portion of the glass substrate 11 on the sixth region 36 does crack during compression-bonding of the driving element unit 22, the crack is less likely to spread to the portion of the glass substrate 11 on the fourth region 34. This effect will be described below with reference to FIGS. 7A and 7B.

Figure 7A:
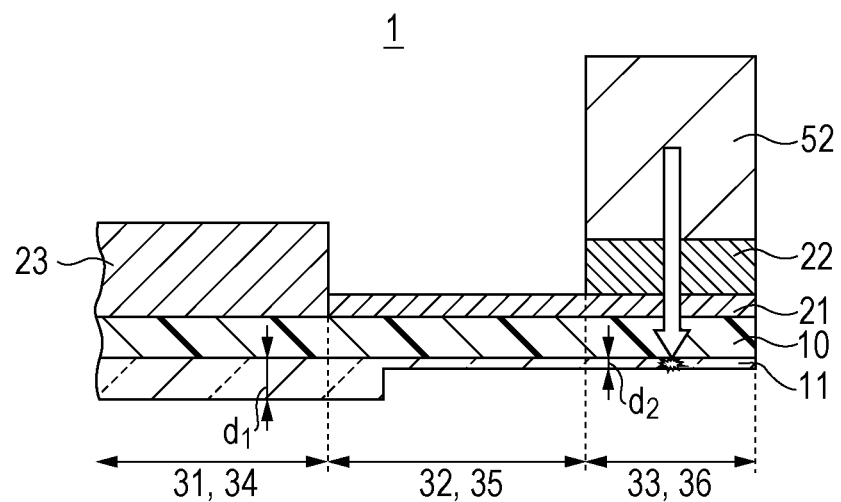
FIG. 7A is a schematic cross-sectional view illustrating an effect of the display device according to the first embodiment shown in FIG. 1.
Figure 7B:
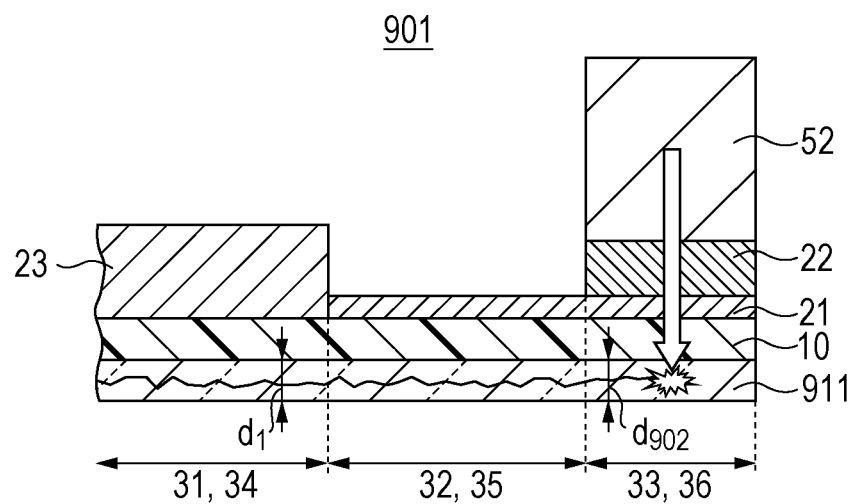
FIG. 7B is a schematic cross-sectional view illustrating an effect of a display device according to a comparative example.

FIG. 7A is a schematic cross-sectional view illustrating the effect of the display device 1 according to the first embodiment. The thickness $d_2$ of the portion of the glass substrate 11 on the sixth region 36 is larger than 0 μm and smaller than or equal to 1 μm. On the other hand, FIG. 7B is a schematic cross-sectional view illustrating an effect of a display device 901 according to a comparative example. A thickness $d_{902}$ of a portion of a glass substrate 911 on the sixth region 36 is larger than 1 µm.

In the display device 901 according to the comparative example, when the compression-bonding head 52 compression-bonds the driving element unit 22, stress occurs in the portion of the glass substrate 911 on the sixth region 36. In the display device 1, similar to the display device 901, stress occurs in the portion of the glass substrate 11 on the sixth region 36. However, the stress occurring in the portion of the glass substrate 911 on the sixth region 36 is larger than the stress occurring in the portion of the glass substrate 11 on the sixth region 36. This is because, in the glass substrate 911 whose portion on the sixth region 36 has the larger thickness $d_{902}$, strain caused by compression-bonding is large and tensile stress further increases, as compared with the glass substrate 11 whose portion on the sixth region 36 has the smaller thickness $d_2$. As a result, in the display device 901, the portion of the glass substrate 911 on the sixth region 36 may break or crack. Thus, the crack spreads to the portion of the glass substrate 911 on the fourth region 34, resulting in reduced sealing properties in the display element unit 23.

In contrast, in the display device 1 according to the first embodiment, since the portion of the glass substrate 11 on the sixth region 36 has a sufficiently small thickness, the occurrence of breakage or cracking of the glass substrate 11 due to compression-bonding can be suppressed. Furthermore, even if the portion of the glass substrate 11 on the sixth region 36 did crack, since tensile stress in the portion of the glass substrate 11 on the sixth region 36 is minimized, spreading of the crack to a portion of the glass substrate 11 that is in contact with the fourth region 34 can be suppressed. As a result, a display device that allows for a good yield and has high storage stability can be provided.

In order to minimize damage, such as a crack, to the glass substrate 11 when bending stress is applied to the display device 1 according to the first embodiment, the thickness of the portion of the glass substrate 11 on the fifth region 35 may be reduced. Furthermore, the thickness of the portion of the glass substrate 11 on the fifth region 35 may be equal to the thickness of the portion of the glass substrate 11 on the sixth region 36. This is because, when the difference between the thickness of the portion of the glass substrate 11 on the sixth region 36 and the thickness of the portions of the glass substrate 11 on the fourth region 34 and the fifth region 35 increases, damage, such as a crack, tends to occur in the section where the thickness of the glass substrate 11 changes, when bending stress is applied to the display device 1. In the display device 1 shown in FIG. 7A, since the portion of the glass substrate 11 on the sixth region 36 remains, damage to the glass substrate 11 can be suppressed when bending stress is applied to the display device 1.

As described above, in the display device 1 according to the first embodiment, the thickness $d_2$ of the portion of the glass substrate 11 on the sixth region 36 is larger than 0 µm and smaller than or equal to 1 µm. Thus, the thickness $d_2$ of the portion of the glass substrate 11 on the sixth region 36 is smaller than the thickness $d_1$ of the portion of the glass substrate 11 on the fourth region 34. Consequently, damage to the glass substrate 11 when connecting the driving element unit 22 to the connecting unit 21b can be suppressed, while sealing properties in the display element unit 23 can be ensured.

Second Embodiment

Figure 8:
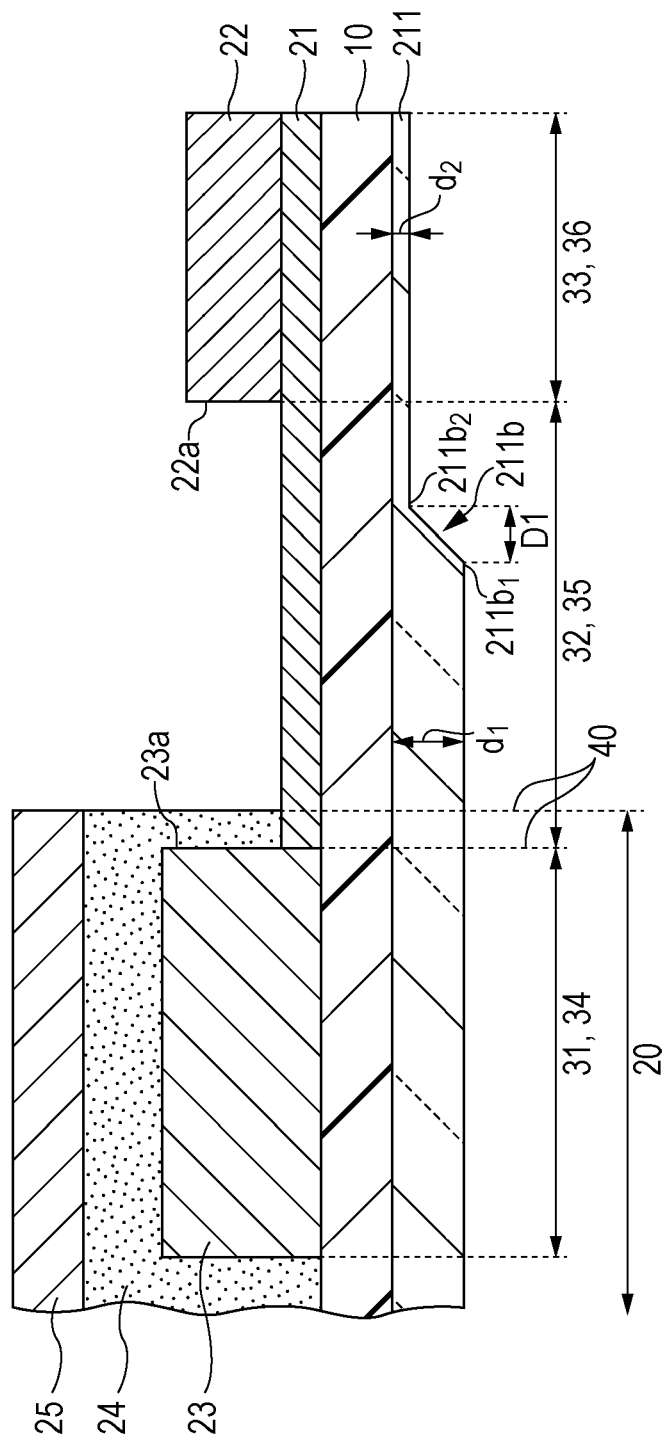
FIG. 8 is a schematic cross-sectional view of a display device according to a second embodiment.

FIG. 8 is a schematic cross-sectional view of a display device 201 according to a second embodiment. The second embodiment is different from the first embodiment in that the section where the thickness of the glass substrate changes has a tapered shape. The following description will be directed only to the differences between the two embodiments. Similar components will be given the same reference characters, and descriptions thereof will be omitted.

The thickness $d_2$ of a portion of a glass substrate 211 on the sixth region 36 is smaller than the thickness $d_1$ of a portion of the glass substrate 211 that is in contact with the fourth region 34. Furthermore, the boundary section where the thickness of the glass substrate 211 changes is a tapered section 211b having a tapered shape whose thickness gradually changes. In the tapered section 211b, the thickness of the glass substrate 211 decreases in a direction toward the portion of the glass substrate 211 on the sixth region 36. In order to manufacture the glass substrate 211 having the tapered section 211b, the etching rate of the resist may be adjusted in the wet-etching process shown in FIG. 4B. Accordingly, at least a part of the glass substrate 211 on the fifth region 35 is etched into a tapered shape so that the thickness decreases in a direction from the portion of the rigid substrate on the fourth region toward the portion of the rigid substrate on the sixth region.

A start point of the tapered section 211b, that is, an end $211b_1$ thereof closer to the portion of the glass substrate 211 on the fourth region 34, is located closer toward an inner peripheral edge 22a (i.e., toward the portion of the glass substrate 211 on the sixth region 36) of the driving element unit 22 relative to an outer peripheral edge 40 of the displaying unit 20 or the display element unit 23. Moreover, an end point of the tapered section 211b, that is, an end $211b_2$ thereof farther from the portion of the glass substrate 211 on the fourth region 34, is located closer toward the inner peripheral edge 22a (i.e., toward the portion of the glass substrate 211 on the sixth region 36) of the driving element unit 22 relative to the end $211b_1$. Thus, the thickness $d_2$ of the portion of the glass substrate 211 on the sixth region 36 is smaller than the thickness $d_1$ of the portion of the glass substrate 211 on the fourth region 34. As a result, damaging or cracking of the portion of the glass substrate 211 on the sixth region 36 can be suppressed.

In the display device 201 according to the second embodiment, the thickness can be changed gradually from the thickness $d_1$ of the portion of the glass substrate 211 on the fourth region 34 to the thickness $d_2$ of the portion of the glass substrate 211 on the sixth region 36. Therefore, spreading of damage or a crack in the glass substrate 211 can be suppressed. Consequently, spreading of breakage or a crack from the portion of the glass substrate 211 on the sixth region 36 can be suppressed. As a result, cracking of the portion of the glass substrate 211 on the fourth region 34 can be suppressed. Therefore, in the display device 201 according to the second embodiment, sealing properties in the display element unit 23 can be further improved.

The following description relates to a preferred shape for the tapered section 211b.

The end point of the tapered section 211b, that is, the end $211b_2$ thereof farther from the portion of the glass substrate 211 on the fourth region 34, may be located closer toward the display element unit 23 relative to the inner peripheral edge 22a of the driving element unit 22. Thus, the thickness of the portion of the glass substrate 211 on the sixth region 36 becomes fixed. Consequently, since the portion of the glass substrate 211 on the sixth region 36 can be made flat, pressure applied to the portion of the glass substrate 211 on the sixth region 36 during compression-bonding can be made constant at any part of the portion of the glass substrate 211 on the sixth region 36. As a result, variations in adhesive force of the ACF and variations in conductivity can be reduced.

Furthermore, the start point of the tapered section 211$b$, that is, the end 211$b_1$ thereof closer to the portion of the glass substrate 211 on the fourth region 34, may be located closer toward the driving element unit 22 relative to an outer peripheral edge 23$a$ of the display element unit 23. Thus, sealing properties in the display element unit 23 can be further improved. The outer peripheral edge 23$a$ of the display element unit 23 indicates an outer peripheral edge of the sealing layer 25 that seals the organic EL elements.

Moreover, in a case where the display element unit 23 includes an emitting layer composed of an organic material and an element sealing layer formed to cover and surround the emitting layer, the following configuration is permissible. The portion of the glass substrate 211 on the fourth region 34 may have a tapered section whose thickness decreases toward the portion of the glass substrate 211 on the sixth region 36. With regard to this tapered section, an end thereof farther from the portion of the glass substrate 211 on the sixth region 36 may be located within the portion of the glass substrate 211 on the fourth region 34 and outside (i.e., outer peripheral side of the display device 201) an outer peripheral edge of the emitting layer covered with and surrounded by the element sealing layer. More specifically, the start point of the tapered section 211$b$, that is, the end 211$b_1$ thereof closer to the portion of the glass substrate 211 on the fourth region 34 (i.e., the end farther from the portion of the glass substrate 211 on the sixth region 36), may be located outside (i.e., outer peripheral side of the display device 201) the outer peripheral edge of the emitting layer (i.e., emitting region) covered with and surrounded by the element sealing layer in the display element unit 23. Thus, the sealing properties can be maintained at a good level at least in the emitting region. Moreover, a large width D1 of the tapered section 211$b$ in the horizontal direction can be ensured. When the tapered section 211$b$ has a large width D1 in the horizontal direction, the thickness of the glass substrate 211 changes gradually. Therefore, damage to the display device 201 can be further suppressed. The number of tapered sections is not limited to one, and may alternatively be two or more.

Third Embodiment

FIG. 9 is a schematic cross-sectional view of a display device 301 according to a third embodiment. The third embodiment is different from the first embodiment in that the glass substrate is in contact with the fourth region 34 and at least a part of the fifth region 35. The following description will be directed only to the differences between the two embodiments. Similar components will be given the same reference characters, and descriptions thereof will be omitted.

In the display device 301 according to the third embodiment, a glass substrate 311 is in contact with the fourth region 34 and at least a part of the fifth region 35. Therefore, pressure is not applied to the glass substrate 311 during compression-bonding of the driving element unit 22, so that stress does not occur within the glass substrate 311. Thus, the glass substrate 311 can be prevented from breaking or cracking.

Fourth Embodiment

Figure 10A:
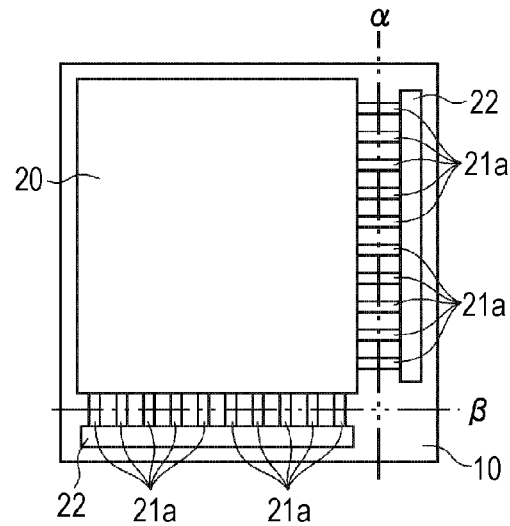
FIG. 10A schematically illustrates a display device according to a fourth embodiment and is a plan view of the display device before it is folded.
Figure 10B:
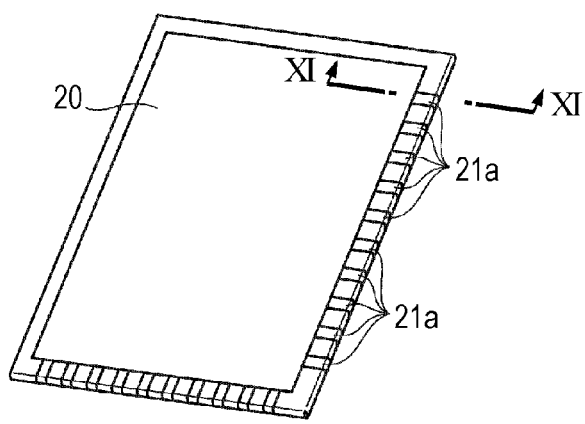
FIG. 10B schematically illustrates the display device according to the fourth embodiment and is a perspective view of the display device in a folded state, as viewed from the front side.
Figure 10C:
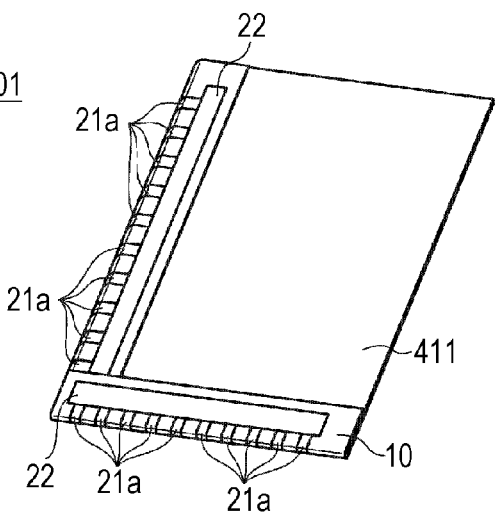
FIG. 10C schematically illustrates the display device according to the fourth embodiment and is a perspective view of the display device in a folded state, as viewed from the rear side.
Figure 11:
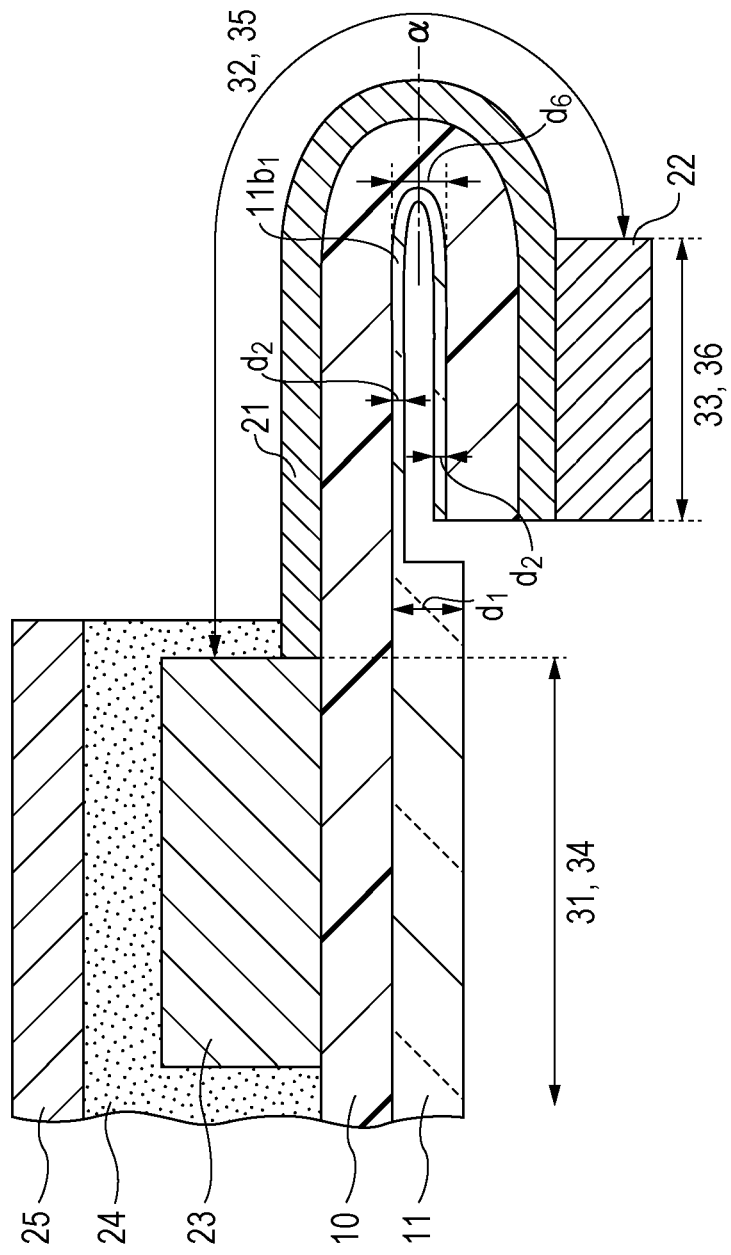
FIG. 11 is a schematic cross-sectional view illustrating the display device shown in FIGS. 10A to 10C.

FIGS. 10A, 10B, and 10C illustrate schematic plan views of a display device 401 according to a fourth embodiment, and FIG. 11 is a schematic cross-sectional view taken along a single-dot chain line XI-XI in FIG. 10B. The fourth embodiment is different from the first embodiment in that the display device 401 is folded at a folding section provided between the second region 32 and the fifth region 35. The following description will be directed only to the differences between the two embodiments. Similar components will be given the same reference characters, and descriptions thereof will be omitted.

When the display device 401 is folded along two-dot chain lines α and β shown in FIG. 10A, the displaying unit 20 appears at the front side as shown in FIG. 10B, whereas the driving element unit 22 is disposed at the rear side as shown in FIG. 10C. Then, the portion of the glass substrate 11 on the fifth region 35 is folded, and the glass substrate 11 on the sixth region is stored. As shown in FIG. 11 (i.e., the cross-sectional view taken along the line XI-XI in FIG. 10B), the resin substrate 10 between the second region 32 and the fifth region 35 is folded into a substantially U-shape, and the driving element unit 22 is provided below the display element unit 23. In other words, the portion of the glass substrate 11 on the sixth region 36 is disposed opposite the display element unit 23 with the resin substrate 10 and the portion of the glass substrate 11 on the fifth region 35 interposed therebetween. Thus, the driving element unit 22 does not protrude outward from the display device 401, whereby the display device 401 can be made narrower.

A thickness $d_6$ of the glass substrate 11 at a folded section thereof located close to the side of the driving element unit 22 (i.e., the two-dot chain lines α and β shown in FIG. 10A) is smaller than the thickness $d_1$ of the portion of the glass substrate 11 on the fourth region 34 and is larger than a sum of the thickness $d_2$ of the portion of the glass substrate 11 on the fifth region 35 and the thickness $d_2$ of the portion of the glass substrate 11 on the sixth region 36. That is, the thickness $d_1$ of the glass substrate 11 on the fourth region 34 is larger than a length dc extending between a first interface and a second interface when the resin substrate 10 is folded to face the fifth region 35 to the sixth region 36. The first interface is placed between the resin substrate 10 and the glass substrate 11 on the fifth region 35. The second interface is placed between the resin substrate 10 and the glass substrate 11 on the sixth region 36. The length $d_6$ extending between the first interface and the second interface is larger than a sum of a thickness $d_2$ of the glass substrate 11 on the fifth region 35 and the thickness $d_2$ of the glass substrate 11 on the sixth region 36.

According to the above configuration, since the portion of the glass substrate 11 on the fifth region 35 is folded and stored, the display device 401 can be reduced in size and can also be reduced in thickness.

Fifth Embodiment

Figure 12:
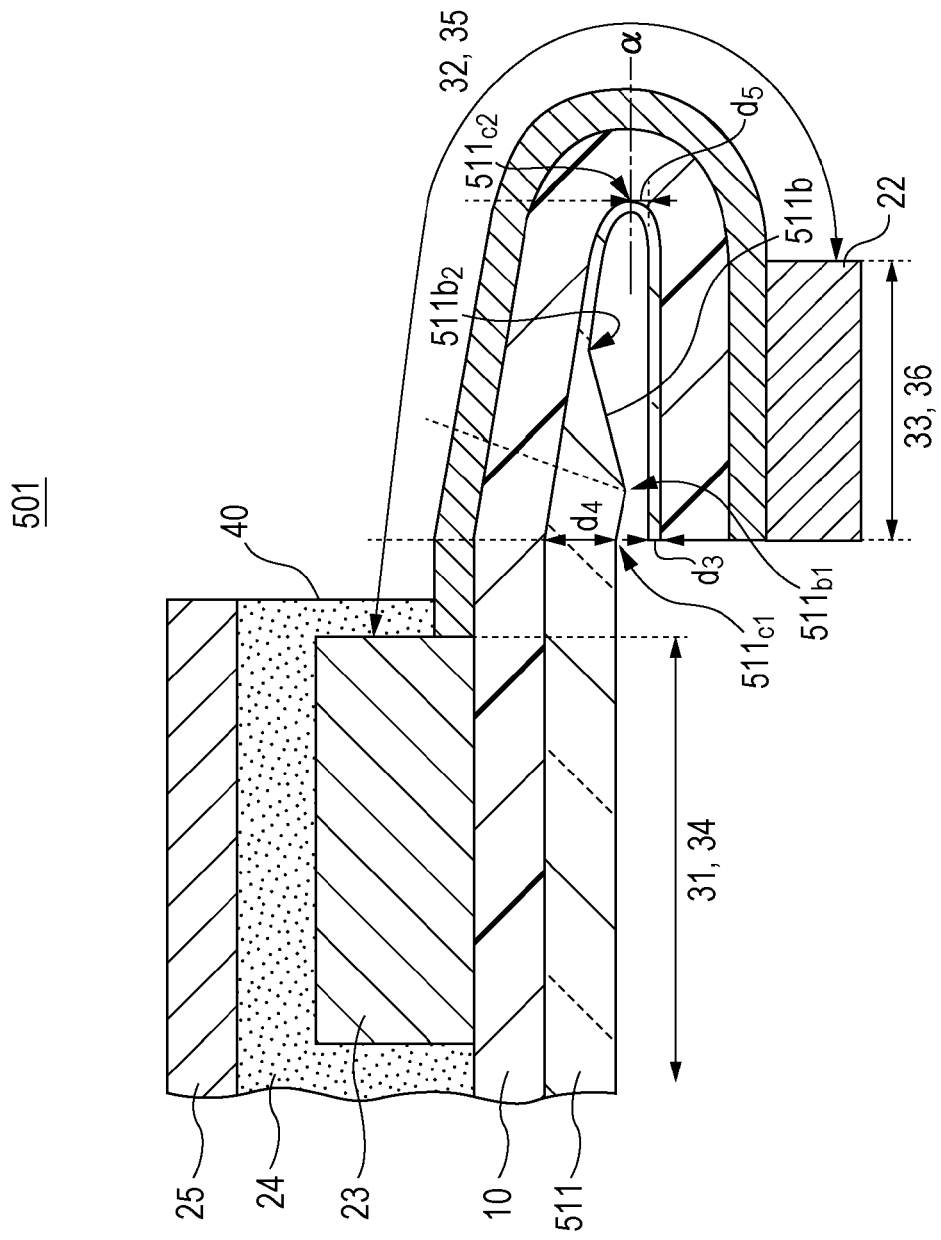
FIG. 12 is a schematic cross-sectional view of a display device according to a fifth embodiment.

FIG. 12 is a schematic cross-sectional view of a display device 501 according to a fifth embodiment. The fifth embodiment is different from the fourth embodiment in that the boundary section where the thickness of the glass substrate changes has a tapered shape instead of a stepped shape. The following description will be directed only to the differences between the two embodiments. Similar components will be given the same reference characters, and descriptions thereof will be omitted.

In the display device 501 according to the fifth embodiment, the boundary section where the thickness of a glass substrate 511 changes is a tapered section 511$b$. In the glass substrate 511, a folded area has a first end 511$c_1$ and a second end 511$c_2$. A start point 511$b$1 of the tapered section 511$b$ is located farther away from the outer peripheral edge 40 of the displaying unit 20 where the display element unit 23 is formed, relative to the first end 511$c$ of the folded area. An end point 511b2 of the tapered section 511b is located farther away from the outer peripheral edge of the displaying unit 20 where the display element unit 23 is formed, relative to the start point 511b1 of the tapered section 511b. Thus, a folding section α of the glass substrate 511 is disposed in a region where the glass substrate 511 has a small thickness. Therefore, even though the display device 501 is folded at the folding section α, the glass substrate 511 is less likely to break or crack. Consequently, sealing properties in the display element unit 23 can be improved.

Furthermore, as shown in FIG. 12, a thickness $d_5$ of the glass substrate 511 at the folding section α is smaller than a sum of a thickness $d_4$ of a portion of the glass substrate 511 that is in contact with the fourth region 34 and a thickness $d_3$ of a portion of the glass substrate 511 that is in contact with the sixth region 36. That is, a sum of the thickness $d_4$ of the glass substrate 511 on the fourth region 34 and the thickness $d_3$ of the glass substrate 511 on the sixth region 36 is larger than a length $d_5$ extending between a first interface and a second interface when the resin substrate 10 is folded to face the fifth region 35 to the sixth region 36. The first interface is placed between the resin substrate 10 and the glass substrate 511 on the fifth region 35. The second interface is placed between the resin substrate 10 and the glass substrate 511 on the sixth region 36.

Thus, since the thickness of the glass substrate 511 at the folding section α can be reduced, stress applied to the folding section α of the glass substrate 511 where the stress is at maximum in the glass substrate 511 can be reduced when the display device 501 is bent. As a result, sealing properties in the display element unit 23 can be further improved.

Sixth Embodiment

Figure 13:
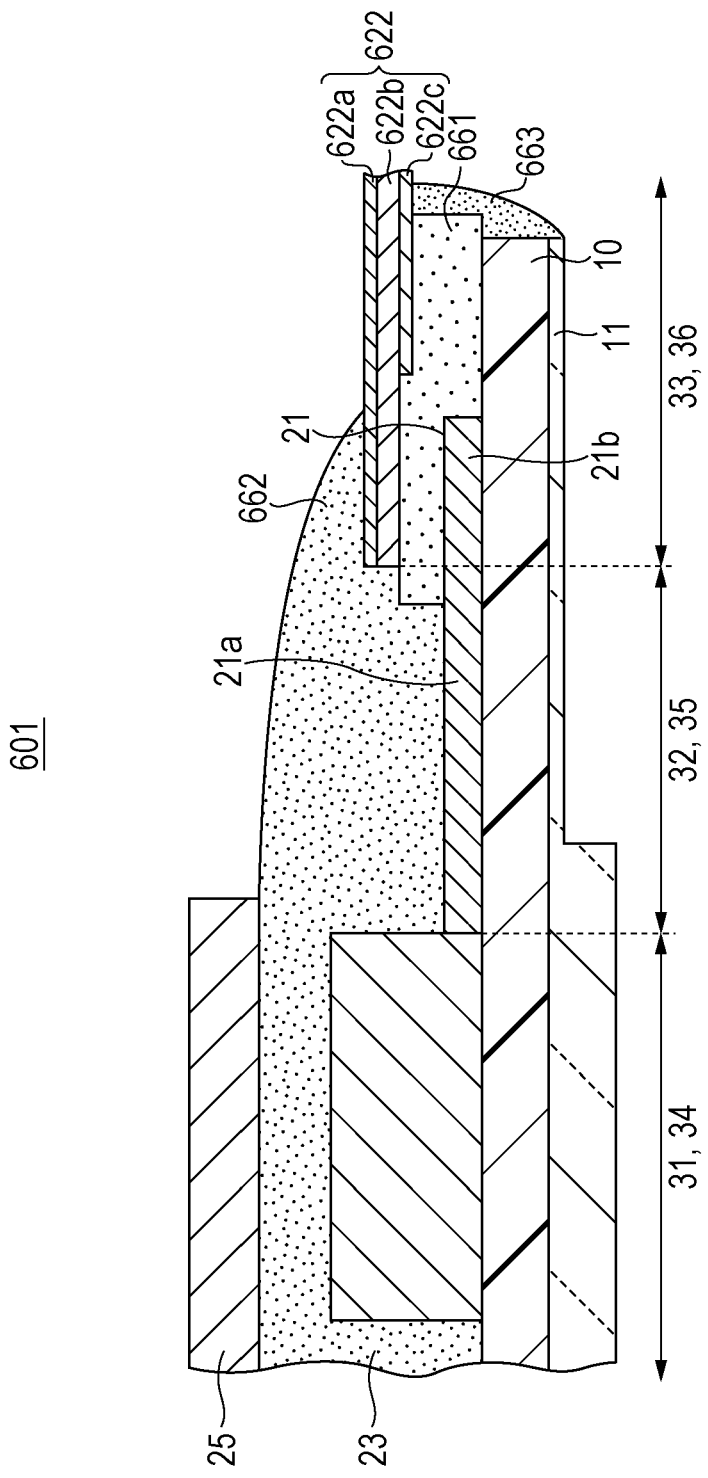
FIG. 13 is a schematic cross-sectional view of a display device according to a sixth embodiment.

FIG. 13 is a schematic cross-sectional view of a display device 601 according to a sixth embodiment. The sixth embodiment is different from each of the above embodiments in that the driving element unit is a flexible printed circuit (FPC) equipped with a driving IC. The following description will be directed only to the differences between the embodiments. Similar components will be given the same reference characters, and descriptions thereof will be omitted.

In the display device 601 according to the sixth embodiment, the driving element unit is constituted of an FPC 622 and a driving IC (not shown). The FPC 622 includes a base film 622a, connection wires 622b, and a cover film 622c. The connecting unit 21b and the FPC 622 are connected to each other by compression-bonding via an anisotropic conductive film (ACF) 661. Thus, the wires 21a are connected to the FPC 622. An adhesive layer 662 is formed at the compression-bonded region between the connecting unit 21b and the FPC 622. Furthermore, an adhesive layer 663 is provided so as to cover the glass substrate 11, the resin substrate 10, the ACF 661, and so on. The ACF 661 is not included in the driving element unit.

In this configuration, the driving IC (not shown) and the wires 21a are connected via the FPC 622. When connecting via the FPC 622, the driving IC is mounted in the FPC 622 such that an outer terminal of the driving IC is disposed on the FPC 622 and is electrically connected to wires provided in the FPC 622. An output terminal of the FPC 622 is electrically connected to the wires 21a, which extend from the display element unit 23, on the FPC 622.

As described below, since the driving element unit is constituted of the FPC 622 and the driving IC, the range of selectivity in terms of design for the position of the driving IC is expanded. For example, when the driving IC is provided outside the FPC 622 (i.e., outside the display device 601), the FPC 622 can be folded so that the display device 601 can be made narrower.

Modifications

A display device according to an aspect of the present disclosure is not limited to the configuration described in each of the above embodiments. Modifications will be described in detail below.

Display Device

Although the display device is of a top emission type in each of the above embodiments, the display device may alternatively be of a bottom emission type.

Although the display device is substantially folded at the folding section in the fourth embodiment, the display device may alternatively be folded at an arbitrary angle. The folding angle may be appropriately set in accordance with the specifications of the product.

Rigid Substrate

Although the rigid substrate is a glass substrate in each of the above embodiments, the rigid substrate may alternatively be composed of a material with higher rigidity than the flexible substrate. Examples of a material with higher rigidity than the flexible substrate include a ceramic material and an alumina material.

Although wet-etching is used for reducing the thickness of the rigid substrate in each of the above embodiments, dry-etching, polishing, or the like may be used as an alternative technique.

Furthermore, the thickness of the rigid substrate is reduced in the L-shaped region existing outside the dashed line shown in FIG. 1 in each of the above embodiments. Alternatively, the thickness of the rigid substrate may be reduced in at least a portion of the rigid substrate on the sixth region 36.

Flexible Substrate

Although the flexible substrate is a resin substrate in each of the above embodiments, the flexible substrate may alternatively be, for example, a fiber reinforced plastic substrate containing glass fibers, or carbon fibers or an organic-inorganic composite resin substrate containing an inorganic filler, such as silica or zeolite.

Furthermore, although the flexible substrate is constituted of a single layer in the above description, a gas barrier layer may alternatively be provided on the flexible substrate for improving the sealing properties. The gas barrier layer may be a thin film composed of, for example, silicon nitride, silicon oxide, silicon oxynitride, silicon oxycarbide, metal, such as aluminum, germanium, zirconium, hafnium, molybdenum, tungsten, chromium, silver, copper, and titanium, or metal oxide of one of these metals.

Although the rigid substrate and the flexible substrate are directly in contact with each other in each of the above embodiments, an adhesive layer may alternatively be disposed between the rigid substrate and the flexible substrate. Examples of the material used for the adhesive layer in this case include silicon resin, acrylic resin, and polyimide resin.

Displaying Unit

The organic EL elements are each constituted of an anode, an emitting layer, and a cathode in each of the above embodiments. Alternatively, each organic EL element may additionally include functional layers, such as an electron injection layer, an electron transport layer, a hole injection layer, and a hole transport layer.

Wires

Although the wires and the connecting unit are integrally formed in each of the above embodiments, the wires and the connecting unit may alternatively be independent components that are electrically connected to each other. Furthermore, the connection between the wires and the driving element unit is not limited to the use of the ACF. Alternatively, a non-conductive film (NCF) may be used. The connection method between the driving element unit and the connecting unit may be a method other than compression-bonding.

Driving Element Unit

In addition to the configuration in each of the above embodiments, the driving element unit may be covered with an additional protective layer.

Miscellaneous

The glass layer is reduced in thickness after forming the displaying unit in, for example, each of the above embodiments. Alternatively, the thickness reduction of the glass layer may be performed before compression-bonding the driving element unit. For example, the thickness reduction of the glass layer may be performed before forming the displaying unit.

Although a display device and a manufacturing method therefor according to aspects of the present disclosure have been described above, the present disclosure is not to be limited to the above embodiments except for essential characteristic elements thereof. For example, the present disclosure includes an embodiment achieved by implementing various modifications conceivable by a skilled person to each of the above embodiments or an embodiment achieved by combining the components and functions in each of the above embodiments within a scope that does not depart from the spirit of the present disclosure.

The display device and the manufacturing method therefor according to the present disclosure are suitably applicable to, for example, a flexible display functioning as, for example, a display equipped in a portable information terminal or the like, and to a manufacturing method therefor.

What is claimed is:

1. A display device comprising:
    a first substrate including a front surface and a rear surface, the front surface at least defining thereon a first region, a second region, and a third region in this order, the rear surface at least defining thereon a fourth region, a fifth region, and a sixth region respectively opposing the first region, the second region and the third region;
    a display element provided on the first region;
    a wire provided on the second region and electrically connected to the display element;
    a driving element provided via the wire above the third region and electrically connected to the wire; and
    a second substrate provided to be in contact with the fourth region, the fifth region, and the six region, and being composed of a material with higher rigidity than the first substrate, a portion thereof in contact with the sixth region having a smaller thickness than a portion thereof in contact with the fourth region.

2. The display device according to claim 1,
    wherein the first substrate comprises a resin substrate, and
    wherein the second substrate comprises a glass substrate.

3. The display device according to claim 2,
    wherein the thickness of the glass substrate on the fourth region is larger than 1 μm and smaller than or equal to 200 μm.

4. The display device according to claim 2,
    wherein the thickness of the glass substrate on the sixth region is larger than 0 μm and smaller than or equal to 1 μm.

5. The display device according to claim 1,
    wherein the thickness of the second substrate on the fourth region is larger than the thickness of the second substrate on the sixth region, with respect to an entire region of the forth region.

6. The display device according to claim 1,
    wherein the second substrate has a tapered section on the fifth region, thickness of the tapered section decreasing in a direction from the second substrate on the fourth region toward the second substrate on the sixth region.

7. The display device according to claim 6,
    wherein an end of the tapered section closer to the second substrate on the fourth region, is located closer toward an inner peripheral edge of the driving element than an outer peripheral edge of the display element, the inner peripheral edge of the driving element being opposed to the outer peripheral edge of the display element.

8. The display device according to claim 1,
    wherein the display element includes an emitting layer composed of an organic material and includes an element sealing layer that surrounds the emitting layer,
    wherein a tapered section is provided on the fifth region, thickness of the tapered section decreasing in a direction toward the second substrate on the sixth region, and
    wherein an end of the tapered section farther from the second substrate on the sixth region, is located within the second substrate on the fourth region and outside an outer peripheral edge of the emitting layer.

9. The display device according to claim 1,
    wherein the driving element includes a driving integrated circuit that supplies electric power to the display element, and
    wherein the wire is connected to the driving integrated circuit.

10. The display device according to claim 1,
    wherein the first substrate is folded to oppose the fifth region to the sixth region.

11. The display device according to claim 10,
    wherein the thickness of the second substrate on the fourth region is larger than a length extending between a first interface and a second interface when the first substrate is folded to face the fifth region to the sixth region, the first interface being placed between the first substrate and the second substrate on the fifth region, the second interface being placed between the first substrate and the second substrate on the sixth region, and
    the length extending between the first interface and the second interface is larger than a sum of a thickness of the second substrate on the fifth region and the thickness of the second substrate on the sixth region.

12. The display device according to claim 10,
    wherein a sum of the thickness of the second substrate on the fourth region and the thickness of the second substrate on the sixth region is larger than a length extending between a first interface and a second interface when the first substrate is folded to face the fifth region to the sixth region, the first interface being placed between the first substrate and the second substrate on the fifth region, the second interface being placed between the first substrate and the second substrate on the sixth region.

13. The display device according to claim 1,
    wherein the first substrate comprises a flexible substrate, and
    wherein the second substrate comprises a rigid substrate.

14. A method for manufacturing a display device, the method comprising:

(a) forming a first substrate on a front surface of a second substrate;
(b) forming a display element on a first region of a front surface of the first substrate;
(c) forming a wire, on a second region of the front surface of the first substrate, the wire being electrically connected to the display element, the second region being different from the first region;
(d) forming a driving element on a third region of the front surface of the first substrate the third region being different from the first region and the second region;
(e) pressing the driving element towards the wire to electrically connect a driving element and the wire to each other on the third region; and
(f) etching at least a portion of the second substrate,
wherein the etching (f) comprises performing etching a portion of the second substrate that is in contact with at least a part of a fifth region and a sixth region of the rear surface of the first substrate, the fifth region and the sixth region being respectively opposed to the second region and the third region of the first substrate, a thickness of the second substrate on the sixth region being smaller than a thickness of the second substrate on the fourth region.

15. The method according to claim 14,
wherein in the etching (f), a recessed end of the second substrate that is formed by the etching (f) is located within an area corresponding to a fifth region of the rear surface of the first substrate, the fifth region being opposed to the second region of the front surface of the first substrate.

16. The method according to claim 14,
wherein in the etching (f), at least a part of the second substrate that is in contact with the fifth region of the rear surface of the first substrate has a tapered shape, the fifth region being opposed to the second region of the front surface of the first substrate, thickness of the tapered shape decreasing in a direction from the second substrate on the fourth region toward the second substrate on the sixth region.

17. The method according to claim 14,
wherein in the etching (f), a first point of the tapered shape is located closer toward an inner peripheral edge of the driving element than an outer peripheral edge of the display element, the inner peripheral edge facing to the outer peripheral edge, and a second point of the tapered shape is located closer toward the inner peripheral edge of the driving element than the start point.

18. A display device comprising:
a first substrate including a front surface and a rear surface, the front surface at least defining thereon a first region, a second region, and a third region, the rear surface at least defining thereon a fourth region, a fifth region, and a sixth region respectively opposing the first region, the second region and the third region;
a display element provided on the first region;
a wire provided on the second region and electrically connected to the display element;
a driving element provided via the wire above the third region and electrically connected to the wire; and
a second substrate provided to be in contact with the fourth region and at least a part of the fifth region.

19. The display device according to claim 18,
wherein the second substrate is not provided on a remaining part of the fifth region and a sixth region of the rear surface of the first substrate, the sixth region being opposed to the third region of the first substrate.

20. A method for manufacturing a display device, the method comprising:
(a) forming a first substrate on a front surface of a second substrate;
(b) forming a display element on a first region of a front surface of the first substrate;
(c) forming a wire, on a second region of the front surface of the first substrate, the wire being electrically connected to the display element, the second region being different from the first region;
(d) forming a driving element on a third region of the front surface of the first substrate the third region being different from the first region and the second region;
(e) pressing the driving element towards the wire to electrically connect a driving element and the wire to each other on the third region; and
(f) etching at least a portion of the second substrate,
wherein the etching (f) comprises performing etching a portion of the second substrate that is in contact with at least a part of a fifth region and a sixth region of a rear surface of the first substrate, the fifth region being opposed to the second region of the first substrate, the sixth region being opposed to the third region of the first substrate.

21. The method according to claim 20,
wherein the second substrate is in contact with the fourth region and at least the part of the fifth region of the rear surface of the first substrate, and
wherein the second substrate is not provided on a remaining part of the fifth region and the sixth region of the rear surface of the first substrate.

* * * * *